United States Patent
Leung

(10) Patent No.: US 7,439,887 B2
(45) Date of Patent: Oct. 21, 2008

(54) METHOD AND APPARATUS FOR GIF DECOMPRESSION USING FIXED-SIZE CODEWORD TABLE

(75) Inventor: Patrick Wai-Tong Leung, Vancouver (CA)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/674,213

(22) Filed: Feb. 13, 2007

(65) Prior Publication Data

US 2008/0191907 A1 Aug. 14, 2008

(51) Int. Cl.
*H03M 7/00* (2006.01)
(52) U.S. Cl. .......................... 341/106; 341/65; 341/67; 341/90; 341/104; 341/105
(58) Field of Classification Search ................. 341/106, 341/104, 105, 107, 65, 67, 90
See application file for complete search history.

(56) References Cited

U.S. PATENT DOCUMENTS

| | | | | |
|---|---|---|---|---|
| 4,558,302 A | * | 12/1985 | Welch | 341/51 |
| 4,992,954 A | * | 2/1991 | Takeda et al. | 715/223 |
| 5,023,610 A | * | 6/1991 | Rubow et al. | 341/51 |
| 5,179,378 A | | 1/1993 | Ranganathan et al. | |
| 5,537,551 A | | 7/1996 | Denenberg et al. | |
| 5,677,690 A | | 10/1997 | Sohn | |
| 5,717,393 A | * | 2/1998 | Nakano et al. | 341/50 |
| 5,951,623 A | * | 9/1999 | Reynar et al. | 708/203 |
| 6,075,470 A | * | 6/2000 | Little et al. | 341/107 |
| 6,285,796 B1 | | 9/2001 | Acharya et al. | |
| 6,404,362 B1 | | 6/2002 | York et al. | |
| 6,466,144 B1 | * | 10/2002 | Cooper | 341/106 |
| 6,624,762 B1 | * | 9/2003 | End, III | 341/51 |
| 6,643,815 B1 | * | 11/2003 | Davis et al. | 714/758 |
| 6,657,564 B2 | | 12/2003 | Malik | |
| 6,747,582 B2 | | 6/2004 | Morihara et al. | |
| 6,842,124 B2 | | 1/2005 | Penna | |
| 6,906,644 B2 | * | 6/2005 | Satoh | 341/51 |
| 7,043,077 B2 | * | 5/2006 | Rijavec | 382/164 |
| 2002/0145545 A1 | * | 10/2002 | Brown | 341/50 |
| 2005/0179939 A1 | * | 8/2005 | Kunihiro | 358/1.15 |
| 2006/0071822 A1 | | 4/2006 | Abdat | |

FOREIGN PATENT DOCUMENTS

| | | |
|---|---|---|
| EP | 0714166 A2 | 5/1996 |
| JP | 04217021 | 8/1992 |
| JP | 07086957 | 3/1995 |
| WO | 9403983 | 2/1994 |
| WO | 9839723 | 9/1998 |
| WO | 0067382 | 11/2000 |

* cited by examiner

*Primary Examiner*—Linh V Nguyen
(74) *Attorney, Agent, or Firm*—Mark P. Watson

(57) ABSTRACT

A fixed-size codeword table is generated for decompressing GIF encoded data. The fixed-size codeword table is defined to store a codeword string and a codeword length for each of a number of codewords. The codeword string is defined by a codeword previously represented in the codeword table and a character. The codeword length represents a total number of characters in the codeword string. A current codeword in the GIF encoded data is translated according to the codeword table to generate a series of characters represented by the current codeword. The generated series of characters is stored in a computer memory space.

17 Claims, 9 Drawing Sheets

| Fixed-Size Codeword Table CW_MEM[CW_ADDR] = {STR_IN, LEN_IN} | | |
|---|---|---|
| Codeword Address (CW_ADDR) | Codeword String (STR_IN) (Codeword, Character) | Codeword Length (LEN_IN) |
| 0 | 0, null | 1 |
| 1 | 1, null | 1 |
| 2 | 2, null | 1 |
| ... | ... | ... |
| 255 | 255, null | 1 |
| 256 | codeword table reset flag | null |
| 257 | end-of-file flag | null |
| 258 | 1, 1 | 2 |
| 259 | 1, 0 | 2 |
| 260 | 0, 0 | 2 |
| 261 | 0, 1 | 2 |
| 262 | 259, 0 | 3 |
| 263 | 261, 0 | 3 |
| 264 | 260, 0 | 3 |
| 265 | 264, 0 | 4 |

```
Initialize the first 256 entries in codeword table with single
character.

OLD_CW = first codeword in codestream (this will always be a single
character present within the first 256 entries of the codeword
table)

CHAR = first character of OLD_CW

OUT_ADDR = 0

Output CHAR at OUT_ADDR

WHILE not End-of-File

CW = next codword in codestream

IF CW is in the codeword table

STR = content of CW

ELSE

STR = content of CW with CHAR appended thereto

END IF

//output content of STR in order starting with first character
   and ending with last character WHILE not end of STR

OUT_ADDR = OUT_ADDR + 1

Output a character of string

END WHILE

CHAR = first character of STR

Next codeword table entry = content of OLD_CW with CHAR appended
   thereto

OLD_CW = CW

END WHILE
```

Fig. 1

| Example Character Stream Input |
|---|
| 1, 1, 0, 0, 1, 0, 0, 1, 0, 0, 0, 0, 0, 0, 1, 0 |

Fig. 2A

| Codestream Generated for Example Character Stream Input |
|---|
| 1, 1, 0, 0, 259, 261, 260, 264, 263, 257 |

Fig. 2B

| Variable-Size Codeword Table ||
|---|---|
| Codeword Address | Codeword String |
| 0 | 0 |
| 1 | 1 |
| 2 | 2 |
| ... | ... |
| 255 | 255 |
| 256 | codeword table reset flag |
| 257 | end-of-file flag |
| 258 | 1, 1 |
| 259 | 1, 0 |
| 260 | 0, 0 |
| 261 | 0, 1 |
| 262 | 1, 0, 0 |
| 263 | 0, 1, 0 |
| 264 | 0, 0, 0 |
| 265 | 0, 0, 0, 0 |

Fig. 2C

| Character Stream Output |||
|---|---|---|
| Time | Output Address | Output Character |
| 0 | 0 | 1 |
| 1 | 1 | 1 |
| 2 | 2 | 0 |
| 3 | 3 | 0 |
| 4 | 4 | 1 |
| 5 | 5 | 0 |
| 6 | 6 | 0 |
| 7 | 7 | 1 |
| 8 | 8 | 0 |
| 9 | 9 | 0 |
| 10 | 10 | 0 |
| 11 | 11 | 0 |
| 12 | 12 | 0 |
| 13 | 13 | 0 |
| 14 | 14 | 1 |
| 15 | 15 | 0 |

Fig. 2D

```
//Initialize the first 256 entries in codeword table with single
character and length of 1.
FOR (I = 0, I <= 255, I = I + 1)
   BEGIN
      CW_ADDR = I    //codeword address
      STR_IN = I     //codeword string input
      LEN_IN = 1     //codeword length
      //write to codeword table
      CW_MEM[CW_ADDR] = {STR_IN, LEN_IN}
   END
CW_ADDR = 257 //point to the last table entry
              //codeword 256 reserved for codeword table reset flag
              //codeword 257 reserved for end-of-file flag
OLD_CW = first codeword in codestream (this will always be a single
         character present within the first 256 entries of the
         codeword table)
CHAR = first character of OLD_CW
ADDR = 0
LEN = 1
OUT_ADDR = 0
Output CHAR at OUT_ADDR //output the character within CHAR to
                        //output address OUT_ADDR in the character
                        //stream
WHILE not End-of-File
   CW = next codword in codestream
   IF CW is in the codeword table
      STR = content of CW.Codeword
      CHAR = content of CW.Character
      LEN = content of CW.Length
   ELSE
      STR = content of OLD_CW.Codeword with CHAR appended thereto
      LEN = content of OLD_CW.Length + 1
   END IF
   //output content of STR in order starting with LAST character
   //and ending with FIRST character
   OUT_LEN = LEN
   WHILE OUT_LEN not equal to 1
      OUT_ADDR = ADDR + OUT_LEN
      Output CHAR at OUT_ADDR //output the character within CHAR to
                              //output address OUT_ADDR in the
                              //character stream
      STR = content of STR.Codeword
      CHAR = content of STR.Character
      OUT_LEN = content of STR.Length
   END WHILE
   OUT_ADDR = ADDR + OUT_LEN
   Output CHAR at OUT_ADDR //output the character within CHAR to
                           //output address OUT_ADDR in the
                           //character stream
   //create next entry in codeword table such that
   //next codeword table entry = content of OLD_CW + CHAR
   CW_ADDR = CW_ADDR + 1 //point to next entry in codeword table
   STR_IN = content of OLD_CW + CHAR
   LEN_IN = content of OLD_CW.Length + 1
   CW_MEM[CW_ADDR] = {STR_IN, LEN_IN}
   ADDR = ADDR + LEN
   OLD_CW = CW
END WHILE
```

Fig. 3

| Codestream Generated for Example Character Stream Input |
|---|
| 1, 1, 0, 0, 259, 261, 260, 264, 263, 257 |

Fig. 4A

| Fixed-Size Codeword Table CW_MEM[CW_ADDR] = {STR_IN, LEN_IN} |||
|---|---|---|
| Codeword Address (CW_ADDR) | Codeword String (STR_IN) (Codeword, Character) | Codeword Length (LEN_IN) |
| 0 | 0, null | 1 |
| 1 | 1, null | 1 |
| 2 | 2, null | 1 |
| ... | ... | ... |
| 255 | 255, null | 1 |
| 256 | codeword table reset flag | null |
| 257 | end-of-file flag | null |
| 258 | 1, 1 | 2 |
| 259 | 1, 0 | 2 |
| 260 | 0, 0 | 2 |
| 261 | 0, 1 | 2 |
| 262 | 259, 0 | 3 |
| 263 | 261, 0 | 3 |
| 264 | 260, 0 | 3 |
| 265 | 264, 0 | 4 |

Fig. 4B

| Character Stream Output |||
|---|---|---|
| Time | Output Address | Output Character |
| 0 | 0 | 1 |
| 1 | 1 | 1 |
| 2 | 2 | 0 |
| 3 | 3 | 0 |
| 4 | 5 | 0 |
| 5 | 4 | 1 |
| 6 | 7 | 1 |
| 7 | 6 | 0 |
| 8 | 9 | 0 |
| 9 | 8 | 0 |
| 10 | 12 | 0 |
| 11 | 11 | 0 |
| 12 | 10 | 0 |
| 13 | 15 | 0 |
| 14 | 14 | 1 |
| 15 | 13 | 0 |

Fig. 4C

| Time | Pointer in Codestream | Codeword in Codestream | CW | STR | CHAR | LEN | OUT_LEN | OUT_ADDR | Output CHAR | CW_ADDR | STR_IN | LEN_IN | CW_MEM | ADDR | OLD_CW |
|---|---|---|---|---|---|---|---|---|---|---|---|---|---|---|---|
| 0 | 1 | "1" | null | null | "1" | 1 | null | 0 | "1" | 257 | null | null | null | 0 | "1" |
| 1 | 2 | "1" | "1" | "1" | "1" | 1 | 1 | 1 | "1" | 258 | "1, 1" | 2 | "1, 1", 2 | 1 | "1" |
| 2 | 3 | "0" | "0" | "0" | "0" | 1 | 1 | 2 | "0" | 259 | "1, 0" | 2 | "1, 0", 2 | 2 | "0" |
| 3 | 4 | "0" | "0" | "0" | "0" | 1 | 1 | 3 | "0" | 260 | "0, 0" | 2 | "0, 0", 2 | 3 | "0" |
| 4 | 5 | "259" | "259" | "1, 0" | "0" | 2 | 2 | 5 | "0" |  |  |  |  |  |  |
| 5 |  |  |  | "1" | "1" |  | 1 | 4 | "1" | 261 | "0, 1" | 2 | "0, 1", 2 | 5 | "259" |
| 6 | 6 | "261" | "261" | "0, 1" | "1" | 2 | 2 | 7 | "1" |  |  |  |  |  |  |
| 7 |  |  |  | "0" | "0" |  | 1 | 6 | "0" | 262 | "259, 0" | 3 | "259, 0", 3 | 7 | "261" |
| 8 | 7 | "260" | "260" | "0, 0" | "0" | 2 | 2 | 9 | "0" |  |  |  |  |  |  |
| 9 |  |  |  | "0" | "0" |  | 1 | 8 | "0" | 263 | "261, 0" | 3 | "261, 0", 3 | 9 | "260" |
| 10 | 8 | "264" | "264" | "260, 0" | "0" | 3 | 3 | 12 | "0" |  |  |  |  |  |  |
| 11 |  |  |  | "0, 0" | "0" |  | 2 | 11 | "0" |  |  |  |  |  |  |
| 12 |  |  |  | "0" | "0" |  | 1 | 10 | "0" | 264 | "260, 0" | 3 | "260, 0", 3 | 12 | "264" |
| 13 | 9 | "263" | "263" | "261, 0" | "0" | 3 | 3 | 15 | "0" |  |  |  |  |  |  |
| 14 |  |  |  | "0, 1" | "1" |  | 2 | 14 | "1" |  |  |  |  |  |  |
| 15 |  |  |  | "0" | "0" |  | 1 | 13 | "0" | 265 | "264, 0" | 4 | "264, 0", 4 | 15 | "263" |
| 16 | 10 | "257" |  |  |  |  |  |  |  |  |  |  |  |  |  |

Fig. 4D

METHOD AND APPARATUS FOR GIF DECOMPRESSION USING FIXED-SIZE CODEWORD TABLE

BACKGROUND

1. Field of the Invention

The present invention relates to decompression of compressed digital data.

2. Description of the Related Art

Digital data compression systems exist to encode a stream of digital data into compressed digital codes and decode the compressed digital codes back into the original digital data. As the compressed digital codes are defined by fewer bits than the stream of digital data, the data compression system serves to effect a savings in the amount of storage required to hold the digital data and the amount of time required to transmit the digital data. The compression ratio is defined as the ratio of the number of bits used to define the compressed digital codes to the number of bits present in the original digital data. The smaller the compression ratio, the greater will be the savings in storage or time.

One technique for digital data compression is known as the LZW method (or Lempel-Ziv-Welch method), and is described in U.S. Pat. No. 4,558,302. Another technique for digital data compression is known as the GIF (Graphics Interchange Format) method, which is a slight modification of the LZW method. Both the straight LZW and the GIF methods compress a stream of data characters, i.e., character stream, into a stream of codewords, i.e., codestream, by taking advantage of character string repetition in the character stream.

During GIF compression and decompression, a codeword table is dynamically generated. Generally speaking, the codeword table is essentially a dictionary of the codewords present in the codestream. During compression, the codeword table is generated as the character stream is encoded to facilitate encoding of subsequent portions of the character stream. Thus, during compression, the character stream is the input and the codestream is the output, with the codeword table being generated to support provision of the codestream and discarded thereafter. During decompression, the codestream is the input and the character stream is the output, with the codeword table being generated to support provision of the character stream and discarded thereafter. The codeword table does not accompany the codestream. It should be appreciated that in terms of bits, the codestream size is smaller than the character stream size. The ratio of the codestream size to the character stream size is the compression ratio.

During conventional GIF decompression, the codeword table is variable in size. More specifically, the length of a character string associated with a given codeword can vary. The maximum character string length that can be present in the codeword table is a function of the original uncompressed data. For instance, if the original uncompressed data does not include much character repetition, the maximum character string length that will need to be stored in the codeword table may be quite large. Thus, when implementing the conventional GIF decompression method, it is necessary to allocate a substantial amount of memory to storing the codeword table in order to accommodate the maximum anticipated character string length that will need to be stored in the codeword table for any particular codeword. When memory resources are abundant, allocation of a large memory space for storage of the codeword table may not be a problem. Conversely, when memory resources are at a premium, allocation of a large memory space for storage of the codeword may not be possible. Thus, conventional GIF decompression methods may not be easily or reliably implemented in situations where memory resources are limited.

In view of the foregoing, a solution is needed to enable decompression of a GIF codestream in situations where memory limitations may prevent storage of the variable-size codeword table associated with the conventional GIF decompression process.

SUMMARY

In one embodiment, a method is disclosed for decompressing Graphics Interchange Format (GIF) encoded data. The method includes an operation for generating a codeword table to store a codeword string and a codeword length for each of a number of codewords. The codeword string is defined by a codeword previously represented in the codeword table and a character. The codeword length represents a total number of characters in the codeword string. The method also includes an operation for translating a current codeword in the GIF encoded data according to the codeword table in order to generate a series of characters represented by the current codeword. The method further includes an operation for storing the generated series of characters in a computer memory space.

In another embodiment, a computer processor for decompressing GIF encoded data is disclosed. The computer processor includes a memory and circuitry configured to generate a codeword table in the memory. The codeword table is defined to store a codeword string and a codeword length for each of a number of codewords. The codeword string is defined by a codeword previously represented in the codeword table and a character. The codeword length represents a total number of characters in the codeword string. The computer processor also includes circuitry configured to receive a stream of codewords representing GIF encoded data to be decompressed. The computer processor further includes circuitry configured to translate a current codeword in the stream of codewords according to the codeword table in order to generate a series of characters represented by the current codeword. Additionally, the computer processor includes circuitry configured to store the generated series of characters in the memory.

In another embodiment, a device for rendering GIF encoded image data is disclosed. The device includes a display, a memory, and a computer processor for decompressing GIF encoded image data. The computer processor includes circuitry configured to generate a codeword table in the memory for storing a codeword string and a codeword length for each of a number of codewords. The codeword string is defined by a codeword previously represented in the codeword table and a character. The codeword length represents a total number of characters in the codeword string. The computer processor also includes circuitry configured to receive a stream of codewords representing the GIF encoded image data. The computer processor further includes circuitry configured to translate a current codeword in the stream of codewords according to the codeword table in order to generate a series of characters represented by the current codeword. The computer processor also includes circuitry configured to render in the display an image portion corresponding to the generated series of characters.

Other aspects of the invention will become more apparent from the following detailed description, taken in conjunction with the accompanying drawings, illustrating by way of example the present invention.

BRIEF DESCRIPTION OF THE DRAWINGS

FIG. 1 is an illustration showing pseudocode for the GIF decompression method using a variable-size codeword table;

FIG. 2A is an illustration showing an exemplary character stream prior to its encoding by the GIF compression method;

FIG. 2B is an illustration showing a codestream generated by the GIF compression of the character stream of FIG. 2A;

FIG. 2C is an illustration showing a codeword table generated in applying the variable-size GIF decompression method;

FIG. 2D is an illustration showing the character stream output produced by the variable-size GIF decompression method;

FIG. 3 is an illustration showing pseudocode for the fixed-size GIF decompression method, in accordance with one embodiment of the present invention;

FIG. 4A is an illustration showing a codestream generated by the GIF compression of the character stream of FIG. 2A;

FIG. 4B is an illustration showing a fixed-size codeword table generated in applying the fixed-size GIF decompression method;

FIG. 4C is an illustration showing the character stream output produced by the fixed-size GIF decompression method; and FIG. 4D is an illustration showing the content of the variables utilized in the pseudocode of FIG. 3, as the codestream of FIG. 4A is processed through the fixed-size GIF decompression method.

DETAILED DESCRIPTION

Figure 5:
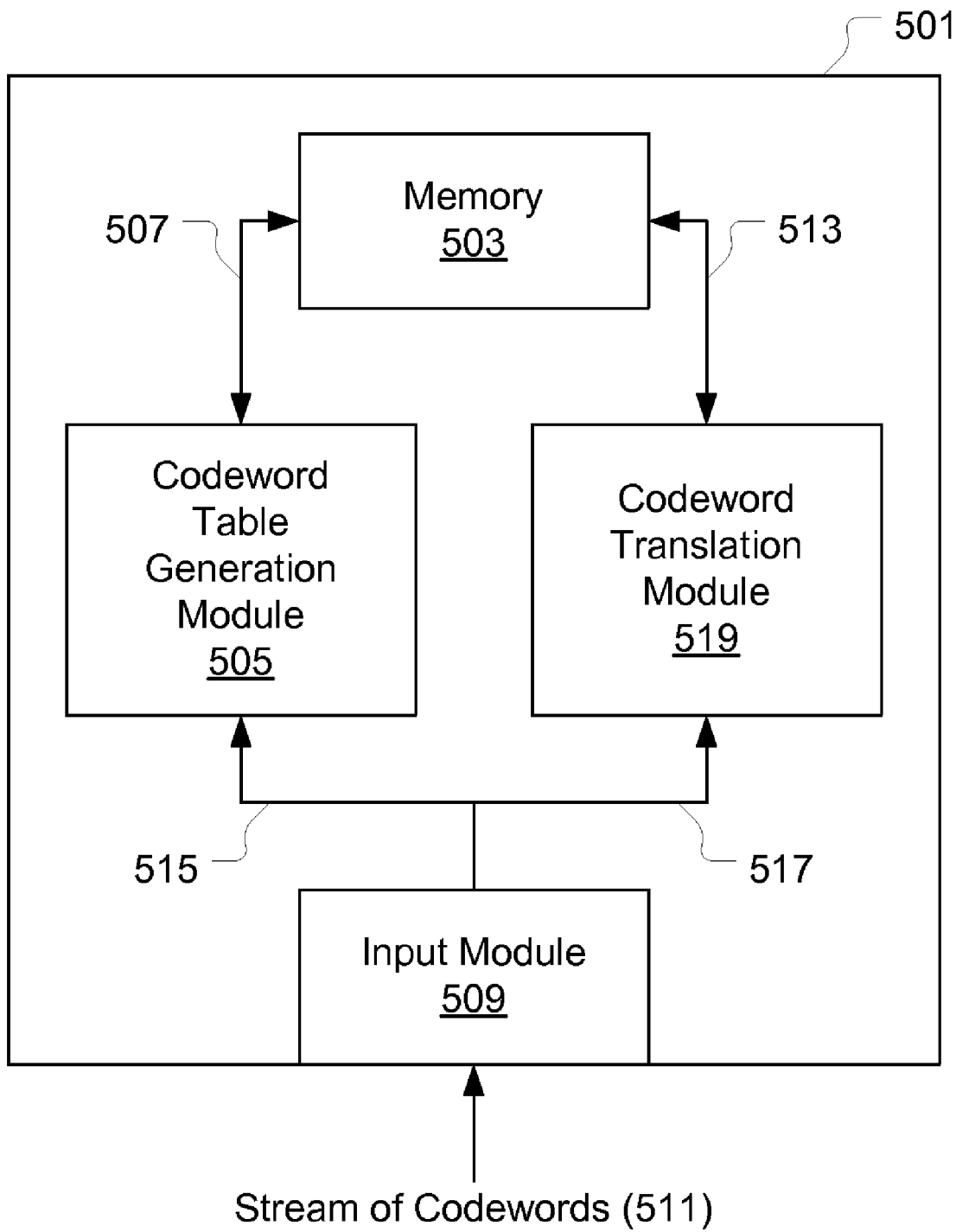
FIG. 5 is an illustration showing the fixed-size GIF decompression method implemented as a computer processor.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

GIF Decompression Method Using Variable-Size Codeword Table

The GIF (Graphics Interchange Format) decompression method takes a codestream as input and generates a character stream as output. The codestream represents as sequence of codewords having been generated by the GIF compression method. Thus, the codestream is an encoded representation of the original data. The character stream output by the GIF decompression method should be identical to the original data.

The GIF decompression method is performed by generating a variable-size codeword table in which a number of character strings are respectively and uniquely associated with a corresponding number of codewords. Each codeword and its associated character string represents and entry in the codeword table. Because of the variable size of each character string, i.e., number of characters in the character string, the codeword table size is allowed to vary. The ultimate size of the variable-size codeword table is dependent upon the original data as encoded within the codestream.

FIG. 1 is an illustration showing pseudocode for the GIF decompression method using a variable-size codeword table. For ease of description, the GIF decompression method using the variable-size codeword table is referred to as the variable-size GIF decompression method. The variable-size GIF decompression process begins with an initialization of the first 256 entries in the codeword table. More specifically, each of the first 256 entries in the codeword table is initialized to have a codeword string representing a single character.

The variable-size GIF decompression method continues with an operation to store the first codeword in the codestream, i.e., the input codestream to be decompressed, to a holding variable "OLD_CW." The GIF compression process ensures that the first codeword in the codestream is a single character that is present as a codeword string within the first 256 codeword table entries. The variable-size GIF decompression method continues by storing the first character of "OLD_CW" to a holding variable "CHAR," i.e., the first character in the codeword string associated with the codeword that is stored in the "OLD_CW" is stored in "CHAR."

Also, an output address variable "OUT_ADDR" is set to 0 (zero). The output address variable "OUT_ADDR" represents an alias for a memory address at which a character in the character stream is to be output. As the character stream represents the output of the variable-size GIF decompression method, i.e., the decompressed data, it should be appreciated that the output address variable "OUT_ADDR" directs the sequence of the characters in the character stream output. An operation is then performed to output the content of the "CHAR" holding variable to the address within character stream that is stored in the "OUT_ADDR" variable. Thus, the character string, i.e., single character, associated with the first codeword in the codestream is output to address 0 (zero) in the character stream.

The variable-size GIF decompression method then processes the remainder of the codestream through execution of a "WHILE" loop. More specifically, each pass through the "WHILE" loop processes a codeword in the codestream. A first operation in the "WHILE" loop is to store the next codeword in the codestream in a holding variable "CW." Then, if the codeword stored in the variable "CW" is already present within the codeword table, a holding variable "STR" is loaded with the codeword string associated with the codeword stored in the variable "CW." Otherwise, if the codeword stored in the variable "CW" is not already present within the codeword table, the holding variable "STR" is loaded with the codeword string associated with the codeword stored in the variable "CW" having the character content of the holding variable "CHAR" appended thereto.

Once the holding variable "STR" is loaded, a process is performed to output the character string content within the holding variable "STR" to the character stream. In the pseudocode of FIG. 1, the process of outputting the content of "STR" is implemented through an inner "WHILE" loop. In each pass of the inner "WHILE" loop, the output address variable "OUT_ADDR" is incremented by 1 (one), and a character of the character string stored within the "STR" variable is output to the character stream address that is stored in the "OUT_ADDR" variable. Thus, the content of the holding variable "STR" is output to the character stream in order beginning with the first character stored in "STR" and ending with the last character stored in "STR."

Following the output of the holding variable "STR" to the character stream, the variable-size GIF decompression method proceeds to update the codeword table. Updating of the codeword table effectively corresponds to adding a new entry to the end of the codeword table. The codeword table updating process begins by storing the first character present within the holding variable "STR" to the holding variable "CHAR." It should be noted that upon the next pass through the "WHILE" loop, this new content of "CHAR" will be used in loading the holding variable "STR" in the event that the next codeword in the codestream is not already present in the codeword table.

Once the "CHAR" variable is updated, a new entry is added to the codeword table and is assigned the next codeword in the sequence of codewords present in the codeword table. The codeword string for the new entry in the codeword table is defined as the codeword string associated with the codeword stored in the "OLD_CW" holding variable having the character content of "CHAR" appended thereto. It should be appreciated that the codeword string is stored in the codeword table as a string of characters. Therefore, as the size, i.e., number of characters, of each codeword string increases, the size of the variable-size codeword table increases. Additionally, in preparation for the next pass through the "WHILE" loop, the codeword stored in the holding variable "CW" is stored in the holding variable "OLD_CW." When the end-of-file codeword (257) is encountered at the beginning of the "WHILE" loop, the "WHILE" loop terminates and the variable-size GIF decompression method is complete.

FIG. 2A is an illustration showing an exemplary character stream prior to its encoding by the GIF compression method. FIG. 2B is an illustration showing a codestream generated by the GIF compression of the character stream of FIG. 2A. FIG. 2C is an illustration showing a codeword table generated in applying the variable-size GIF decompression method, as previously described with regard to FIG. 1. FIG. 2D is an illustration showing the character stream output produced by the variable-size GIF decompression method, as previously described with regard to FIG. 1.

It should be appreciated that the codeword table of FIG. 2C is a variable-size codeword table, where the codeword table size depends on the content of the compress file. The size of the variable-size codeword table usually ranges between 25 kilobytes (KB) to 40 KB for a 640 pixel by 480 pixel image. The large size of the variable-size codeword table is generally not a problem for a software implementation of the variable-size GIF decompression method, as described with regard to FIG. 1, as there will be sufficient system memory available. However, if system memory is limited, such as in a hardware implementation of the GIF decompression process, sufficient memory may not be available for storing the variable-sized codeword table. Additionally, provision of sufficient memory for storing the variable-sized codeword table in a hardware implementation of the GIF decompression process can be prohibitive with regard to cost and chip area utilization.

GIF Decompression Method Using Fixed-Size Codeword Table

In one embodiment of the present invention, a new GIF decompression method is provided to generate and utilize a fixed-size codeword table, as opposed to a variable-size codeword table. For ease of description, the GIF decompression method using the fixed-size codeword table is referred to as the fixed-size GIF decompression method. The fixed-size GIF decompression method takes a codestream as input and generates a character stream as output. The codestream represents as sequence of codewords having been generated by the GIF compression method. Thus, the codestream is an encoded representation of the original data. The character stream output by the fixed-size GIF decompression method is identical to the original data.

The fixed-size GIF decompression method is performed by generating a fixed-size codeword table in which a codeword string and length is defined for each codeword. Each codeword string at a given entry in the codeword table is defined by combination of a previously entered codeword and character. The length defined for a given codeword represents the number of characters in the codeword string when fully expanded to the character level. The codeword portion of each codeword string entry is defined by a fixed number of bits. The character portion of each codeword string entry is defined by a fixed number of bits. Also, the length portion of each codeword entry is defined by a fixed number of bits. Therefore, each codeword entry (codeword string and length) within the codeword table is defined by a fixed number of bits. Thus, the width of the codeword table is defined by a fixed number of bits for each codeword entry. Consequently, the overall size of the fixed-size codeword table can be managed by setting the number of allowed codeword entries.

FIG. 3 is an illustration showing pseudocode for the fixed-size GIF decompression method, in accordance with one embodiment of the present invention. The fixed-size GIF decompression method begins with an initialization of the first 256 entries in the fixed-size codeword table. This initialization process is described using a "FOR" loop, in which each pass through the for loop initializes a sequential one of the first 256 entries in the fixed-size codeword table. A holding variable "CW_ADDR" is used to store a codeword address in the codeword table. A holding variable "STR_IN" is used to store the codeword portion of the codeword string associated with the codeword table entry. During each pass through the "FOR" loop, the value stored in "CW_ADDR" and "STR_JIN" is updated to correspond to current loop counter "I" value which is incremented sequentially from 0 through 255 as the "FOR" loop cycles. A holding variable "LEN_IN" is set to 1 (one), and is used to define the length of the codeword string associated with the codeword table entry. The fixed-size codeword table is represented by an array structure "CW_MEM[CW_ADDR]" The content of "STR_IN" and "LEN_IN" is stored in the array structure "CW_MEM[CW_ADDR]" as the initialization "FOR" loop cycles.

Codeword 256 is reserved for use as a codeword table reset flag. Thus, when codeword 256 is encountered in the codestream, the codeword table will be reset, i.e., reinitialized. Codeword 257 is reserved for use as an end-of-file flag. Thus, when codeword 257 is encountered in the codestream, the fixed-size GIF decompression method stops. Following initialization of the first 256 codeword table entries, the "CW_ADDR" variable is set to 257, so as to point to the last entry in the codeword table.

The fixed-size GIF decompression method continues with an operation to store the first codeword in the codestream, i.e., the input codestream to be decompressed, to the holding variable "OLD_CW." The GIF compression process ensures that the first codeword in the codestream is a single character that is present as a codeword portion of a codeword string within the first 256 codeword table entries. The fixed-size GIF decompression method continues by storing within the holding variable "CHAR" the first character in the codeword string that is associated with the codeword stored in "OLD_CW."

A holding variable "ADDR" is set to 0 (zero). A holding variable "LEN" is set to 1 (one). Also, an output address variable "OUT_ADDR" is set to 0 (zero). The output address variable "OUT_ADDR" represents an alias for a memory address at which a character in the character stream is to be output. As the character stream represents the output of the fixed-size GIF decompression method, i.e., the decompressed data, it should be appreciated that the output address variable "OUT_ADDR" directs the sequence of the characters in the character stream output.

The fixed-size GIF decompression method then proceeds with an operation to output the content of the "CHAR" holding variable to the address within character stream that is stored in the "OUT_ADDR" variable. Thus, the character string, i.e., single character, associated with the first codeword in the codestream is output to address 0 (zero) in the character stream.

The fixed-size GIF decompression method then processes the remainder of the codestream through execution of a "WHILE" loop. More specifically, each pass through the "WHILE" loop processes a codeword in the codestream. A first operation in the "WHILE" loop is to store the next codeword in the codestream in a holding variable "CW." Then, if the codeword stored in the variable "CW" is already present within the codeword table, a holding variable "STR" is loaded with the codeword portion of the codeword string associated with the codeword stored in the variable "CW." Also, if the codeword stored in the variable "CW" is already present within the codeword table, the holding variable "CHAR" is loaded with the character portion of the codeword string associated with the codeword stored in the variable "CW." Also, if the codeword stored in the variable "CW" is already present within the codeword table, the holding variable "LEN" is loaded with the length value associated with the codeword stored in the variable "CW."

Otherwise, if the codeword stored in the variable "CW" is not already present within the codeword table, the holding variable "STR" is loaded with the codeword portion of the codeword string associated with the codeword stored in the variable "OLD_CW" having the character content of the holding variable "CHAR" appended thereto. Also, if the codeword stored in the variable "CW" is not already present within the codeword table, a length value equal to the length value associated with the codeword stored in the variable "OLD_CW" plus 1 (one) is stored in the holding variable "LEN."

Once the "STR," "CHAR," and "LEN" variable are updated based on the codeword stored in the variable "CW," a process is performed to output the character content of "STR" to the character stream in reverse order, i.e., beginning with the last character and ending with the first character. The character stream output process begins with loading of a holding variable "OUT_LEN" with the length value currently stored in the "LEN" variable. Then, if the value stored in "OUT_LEN" is not equal to 1 (one), an inner "WHILE" loop is performed to output the character content of "STR" to the character stream until the value stored in "OUT_LEN" is equal to 1 (one).

In each pass of the inner "WHILE" loop, the output address variable "OUT_ADDR" is set equal to the sum of the values currently stored in the "ADDR" and "OUT_LEN" variables. Then, the character currently stored in the "CHAR" variable is output to the address within character stream that is stored in the "OUT_ADDR" variable. The "STR," "CHAR," and "OUT_LEN" variables are then updated for the next pass through the inner "WHILE" loop. More specifically, the "STR" variable is loaded with the codeword portion of the codeword string associated with the codeword previously stored in the "STR" variable. Then, the "CHAR" variable is loaded with the character portion of the codeword string associated with the codeword now stored in the "STR" variable. Then, the "OUT_LEN" variable is loaded with the length value associated with the codeword now stored in the "STR" variable.

At entry or re-entry of the inner "WHILE" loop, if the value stored in "OUT_LEN" is equal to 1 (one), the inner "WHILE" loop is not performed, and the fixed-size GIF decompression method proceeds with an operation to set the "OUT_ADDR" variable equal to the sum of the values currently stored in the "ADDR" and "OUT_LEN" variables. Then, the character currently stored in the "CHAR" variable is output to the address within character stream that is stored in the "OUT_ADDR" variable.

Following output of the character content of "STR" to the character stream in reverse order, the fixed-size GIF decompression method proceeds to update the codeword table. Updating of the codeword table effectively corresponds to adding a new entry to the end of the codeword table. The codeword table updating process begins with an operation to increment the value currently stored in the "CW_ADDR" variable by 1 (one). This operation effectively makes the "CW_ADDR" variable point to the next entry in the codeword table, i.e., point the new entry that is to be created in the codeword table as a result of the codeword table updating process. The variable "STR_IN" is then loaded with the content of "OLD_CW" and the content of "CHAR," wherein the content of "CHAR" represents the latest character output to the character stream.

It should be understood that "STR_IN" includes two separate portions. The codeword portion of "STR_IN" corresponds to the content of "OLD_CW." The character portion of "STR_IN" corresponds to the content of "CHAR." The variable "LEN_IN" is then loaded with a value equal to the length value associated with the codeword that is stored in the "OLD_CW" variable plus 1 (one). The content of "STR_IN" and "LEN_IN" is then stored in the array structure "CW_MEM[CW_ADDR]" to update the codeword table.

Following the update of the codeword table, the "ADDR" and "OLD_CW" variables are updated for the next pass through the "WHILE" loop. More specifically, the "ADDR" variable is set equal to the sum of the value previously stored in the "ADDR" variable and the value stored in the "LEN" variable. Additionally, in preparation for the next pass through the "WHILE" loop, the codeword stored in the holding variable "CW" is stored in the holding variable "OLD_CW." When the end-of-file codeword (257) is encountered at the beginning of the "WHILE" loop, the "WHILE" loop terminates and the fixed-size GIF decompression method is complete.

FIG. 4A is an illustration showing a codestream generated by the GIF compression of the character stream of FIG. 2A. FIG. 4B is an illustration showing a fixed-size codeword table generated in applying the GIF decompression method using a fixed-size codeword table as previously described with regard to FIG. 3. FIG. 4C is an illustration showing the character stream output produced by the GIF decompression method using the fixed-size codeword table as previously described with regard to FIG. 3. FIG. 4D is an illustration showing the content of the variables utilized in the pseudocode of FIG. 3, as the codestream of FIG. 4A is processed through the fixed-size GIF decompression method.

Considering the data presented in FIGS. 4A-4D, the fixed-size GIF decompression method as applied to the codestream of FIG. 4A proceeds as follows. The first codeword "1" is read into "OLD_CW" and output as string "1" in the character stream. The next codeword "1" is read into "CW." Since the codeword "1" is already in the codeword table, "STR" is set to string "1" and "CHAR" is set to "1" and output to the character stream. The codeword table is updated to include codeword 258. For codeword 258, the codeword portion of the codeword string is set to "1" and the character portion of the codeword string is set to "1". Also, for codeword 258, the length is set to 2. Then, "OLD_CW" is set to "1," i.e., the content of "CW."

The fixed-size GIF decompression method then jumps to the beginning of the "WHILE" loop and proceeds with the processing of the next codeword in the codestream. The next two codewords in the codestream, i.e., codewords "0" and "0," are processed with the corresponding creation of codeword table entries 259 and 260. At this time "OLD_CW" is set to "0", "CHAR" is set to "0", "ADDR" is set to 3, and the next available codeword entry is 261.

Now the next codeword "259" is read in from the codestream, "STR" is set to "1", "CHAR" is set to "0," and "LEN" is set to 2. When the inner "WHILE" loop is executed, "OUT_LEN" is set to 2, and character "0" is output at "OUT_ADDR" equal to 5. Now "STR" is loaded with new codeword "1", "CHAR" is loaded with new character "1," and "OUT_LEN" is loaded with value 1. Then, "CHAR" content of "1" is output at "OUT_ADDR" equal to 4. The codeword table is updated to include codeword 261. For codeword 261, the codeword portion of the codeword string is set to "0" and the character portion of the codeword string is set to "1". Also, for codeword 261, the length is set to 2. Then, "OLD_CW" is set to "259" and "ADDR" is updated to 5. The fixed-size GIF decompression method then jumps to the beginning of the "WHILE" loop and proceeds with processing the remainder of the codestream until the end-of-file is detected, i.e., until codeword 257 is detected.

As discussed above with regard to FIGS. 3-4D, the present invention can be embodied as a method for decompressing GIF encoded data. This method includes an operation for generating a codeword table to store a codeword string and a codeword length for each of a number of codewords. The codeword string is defined by a codeword previously represented in the codeword table and a character. The codeword length represents a total number of characters in the codeword string. The method also includes an operation for translating a current codeword in the GIF encoded data, i.e., in the codestream, according to the codeword table as generated thus far during the decompression process, such that a series of characters represented by the current codeword are generated. The series of characters generated through translation of the current codeword are stored in a computer memory space.

It should be appreciated that the series of characters generated through translation of the current codeword includes the character in the character string associated with the current codeword, and a character that defines a codeword string associated with the codeword that is referenced by the current codeword. For example, with reference to FIG. 4B, the series of characters generated through translation of current codeword 263 includes the character "0" in the character string associated with codeword 263, the character "1" in the codeword string associated with codeword 261 that is referenced by the current codeword 263, and the character "0" in the codeword string associated with codeword 0 that is referenced by codeword 261. Thus, in the above example, the series of characters generated through translation of current codeword 263 is "0," "1," "0." The series of characters "0," "1," "0" represents an expansion of the codeword 263 to the character level.

It should be further appreciated that storing of the series of character in the computer memory space includes writing the series of characters represented by the current codeword to the computer memory space in a sequential order beginning with a last character in the series of characters and ending with a first character in the series of characters. For example, with reference to FIG. 4C, the series of characters ("0," "1," "0") represented by the current codeword 263 is written to memory space over times 13, 14, and 15. At time 13, the last character "0" in the series of characters is written to memory address 15. At time 14, the next-to-last character "1" in the series of characters is written to memory address 14. At time 15, the first character "0" in the series of characters is written to memory address 13.

In one embodiment, the fixed-size codeword table is defined such that codeword portion of the codeword string is stored as a 12 bit value, the character portion of the codeword string is stored as an 8 bit value, and the codeword length is stored as a 12 bit value. Thus, each codeword table entry is defined by a total of 32 bits, i.e., 4 bytes. Each codeword entry in the codeword table can be considered to represent one 4 byte word. If the codeword table is set to hold 4096 ($2^{12}$) words, the overall size of the codeword table will be fixed at 16384 bytes (4096 words*4 bytes/word=16384 bytes). As compared with variable-size codeword tables that can exceed 1.5 megabytes (MB) in some instances, the 16384 byte fixed-size codeword table represents a significant savings in terms of required memory space for performing the GIF decompression process. Thus, the 16 KB fixed-size codeword table can enable hardware implementation of the GIF decompression process, and contain associated hardware implementation costs. Additionally, it should be appreciated that because each entry in the fixed-size codeword table has a fixed length of 4 bytes (as opposed to a variable length of 1 to 1791 bytes in the case of the variable-size codeword table) the fixed-size codeword table greatly simplifies the control logic required for hardware implementation of the codeword table as part of the GIF decompression process.

FIG. 5 is as illustration showing the fixed-size GIF decompression method implemented as a computer processor 501, in accordance with one embodiment of the present invention. The computer processor 501 includes an input module 509 having circuitry defined to receive a stream of codewords 511 representing GIF encoded data to be decompressed. The computer processor 501 also includes a codeword table generation module 505 defined to receive the stream of codewords 511 from the input module, as indicated by connection 515.

The codeword table generation module 505 includes circuitry defined to generate a codeword table in a memory 503. The codeword table is defined to store a codeword string and a codeword length for each of a number of codewords. The codeword string is defined by a codeword previously represented in the codeword table and a character. The codeword length represents a total number of characters in the codeword string.

In one embodiment, the memory 503 is defined within the computer processor 501. In another embodiment, the memory 503 is defined outside the computer processor 501 and is accessible by the computer processor 501. As indicated by connection 507, the codeword table generation module 505 is defined to communicate with the memory 503 in a bi-directional manner.

The computer processor 501 further includes a codeword translation module 519 defined to receive a current codeword from the stream of codewords 511, via a connection 517. The codeword translation module 519 includes circuitry defined to translate the current codeword received in the stream of codewords 511 according to the codeword table in order to generate a series of characters represented by the current codeword. The codeword translation module 519 also includes circuitry defined to store the generated series of characters in the memory 503. As indicated by connection 513, the codeword translation module 519 is defined to communicate with the memory 503 in a bi-directional manner.

Figure 6:
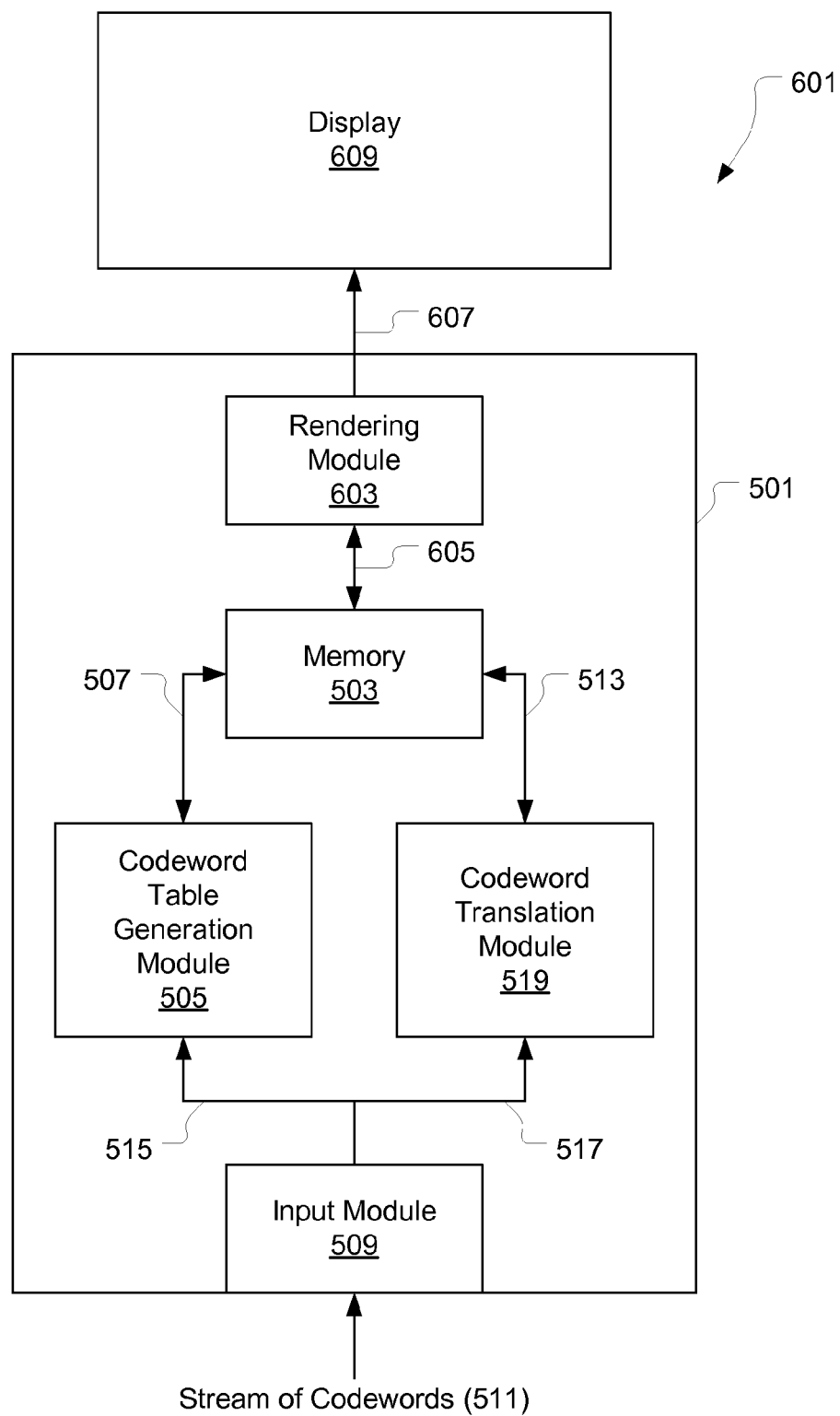
FIG. 6 is an illustration showing a device for rendering GIF encoded image data.

FIG. 6 is an illustration showing a device 601 for rendering GIF encoded image data, in accordance with one embodiment of the present invention. The device 601 includes a display 609 for rendering digital image data and the computer processor 501 described with regard to FIG. 5. In the embodiment of FIG. 6, the computer processor 501 also includes a rendering module 603 having circuitry defined to render in the display 609 an image portion corresponding to a series of characters generated through translation of a codeword using the fixed-size codeword table. The rendering module 603 is defined to access the memory 503 via connection 605 and transmit signals to the display 609 via connection 607.

One skilled in the art will appreciate that the circuitry required to implement the fixed-size GIF decompression method in hardware can be defined on a semiconductor chip using logic gates configured to provide the required functionality. For example, a hardware description language (HDL) can be employed to synthesize hardware and a layout of the logic gates for providing the necessary functionality described herein.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for decompressing Graphics Interchange Format (GIF) encoded data, comprising:
generating a codeword table to store a codeword string and a codeword length for each of a number of codewords, wherein the codeword string is defined by a codeword previously represented in the codeword table and a character, wherein the codeword length represents a total number of characters in the codeword string;
translating a current codeword in the GIF encoded data according to the codeword table to generate a series of characters represented by the current codeword; and
storing the series of characters in a computer memory space; and
wherein the codeword and the character defining each codeword string in the codeword table are defined by a first and second number of bits, respectively, and wherein each codeword length in the codeword table is defined by third number of bits.

2. A method for decompressing GIF encoded data as recited in claim 1, wherein the first and third number of bits are the same.

3. A method for decompressing GIF encoded data as recited in claim 1, wherein the first number of bits is 12, the second number of bits is 8, and the third number of bits is 12.

4. A method for decompressing GIF encoded data as recited in claim 1, wherein a total number of codewords represented in the codeword table is fixed.

5. A method for decompressing GIF encoded data as recited in claim 1, wherein the series of characters represented by the current codeword includes the character in the character string associated with the current codeword and a character that defines a codeword string associated with the codeword referenced by the current codeword.

6. A method for decompressing GIF encoded data as recited in claim 1, wherein storing the series of characters in a computer memory space includes writing the series of characters represented by the current codeword to the computer memory space in a sequential order beginning with a last character in the series of characters and ending with a first character in the series of characters.

7. A computer processor for decompressing Graphics Interchange Format (GIF) encoded data, comprising:
a memory;
circuitry configured to generate a codeword table in the memory for storing a codeword string and a codeword length for each of a number of codewords, wherein the codeword string is defined by a codeword previously represented in the codeword table and a character, wherein the codeword length represents a total number of characters in the codeword string;
circuitry configured to receive a stream of codewords representing GIF encoded data to be decompressed;
circuitry configured to translate a current codeword in the stream of codewords according to the codeword table to generate a series of characters represented by the current codeword; and
circuitry configured to store the series of characters in the memory; and
wherein the codeword and the character defining each codeword string in the codeword table are defined by a first and second number of bits, respectively, and wherein each codeword length in the codeword table is defined by third number of bits.

8. A computer processor for decompressing GIF encoded data as recited in claim 7, wherein the first and third number of bits are the same.

9. A computer processor for decompressing GIF encoded data as recited in claim 7, wherein the first number of bits is 12, the second number of bits is 8, and the third number of bits is 12.

10. A computer processor for decompressing GIF encoded data as recited in claim 7, wherein a total number of codewords represented in the codeword table is fixed.

11. A computer processor for decompressing GIF encoded data as recited in claim 7, wherein the series of characters represented by the current codeword includes the character in the character string associated with the current codeword and a character that defines a codeword string associated with the codeword referenced by the current codeword.

12. A computer processor for decompressing GIF encoded data as recited in claim 7, wherein the circuitry configured to store the series of characters in the memory is configured to write the series of characters represented by the current codeword to the computer memory in a sequential order beginning with a last character in the series of characters and ending with a first character in the series of characters.

13. A device for rendering Graphics Interchange Format (GIF) encoded image data, comprising:
- a display;
- a memory;
- a computer processor for decompressing GIF encoded image data, the computer processor including,
  - circuitry configured to generate a codeword table in the memory for storing a codeword string and a codeword length for each of a number of codewords, wherein the codeword string is defined by a codeword previously represented in the codeword table and a character, wherein the codeword length represents a total number of characters in the codeword string;
  - circuitry configured to receive a stream of codewords representing the GIF encoded image data;
  - circuitry configured to translate a current codeword in the stream of codewords according to the codeword table to generate a series of characters represented by the current codeword; and
- circuitry configured to render in the display an image portion corresponding to the series of characters; and
- wherein the codeword and the character defining each codeword string in the codeword table are defined by a first and second number of bits, respectively, and wherein each codeword length in the codeword table is defined by third number of bits.

14. A device for rendering GIF encoded image data as recited in claim 13, wherein the first and third number of bits are the same.

15. A device for rendering GIF encoded image data as recited in claim 13, wherein the first number of bits is 12, the second number of bits is 8, and the third number of bits is 12.

16. A device for rendering GIF encoded image data as recited in claim 13, wherein the series of characters represented by the current codeword includes the character in the character string associated with the current codeword and a character that defines a codeword string associated with the codeword referenced by the current codeword.

17. A device for rendering GIF encoded image data as recited in claim 13, wherein the computer processor for decompressing GIF encoded image data further includes circuitry configured to write the series of characters in the memory in a sequential order beginning with a last character in the series of characters and ending with a first character in the series of characters.

* * * * *